United States Patent
Lo et al.

(10) Patent No.: US 7,745,343 B1
(45) Date of Patent: Jun. 29, 2010

(54) METHOD FOR FABRICATING SEMICONDUCTOR DEVICE WITH FUSE ELEMENT

(75) Inventors: Wen-Hsun Lo, Hsinchu County (TW); Hsing-Chao Liu, Hsinchu County (TW); Jin-Dong Chern, Taoyuan County (TW); Kwang-Ming Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/431,643

(22) Filed: Apr. 28, 2009

(30) Foreign Application Priority Data

Feb. 12, 2009 (TW) .............................. 98104438 A

(51) Int. Cl.
*H01L 21/00* (2006.01)
(52) U.S. Cl. .................... 438/723; 438/699; 438/601
(58) Field of Classification Search ................ 438/723, 438/699, 601
See application file for complete search history.

(56) References Cited

U.S. PATENT DOCUMENTS

| | | | | |
|---|---|---|---|---|
| 5,989,784 A * | 11/1999 | Lee et al. | ..................... | 430/316 |
| 6,194,318 B1 * | 2/2001 | Ikeda | ........................ | 438/699 |
| 6,300,252 B1 * | 10/2001 | Ying et al. | .................. | 438/723 |
| 6,500,750 B1 * | 12/2002 | Shroff et al. | ................ | 438/622 |
| 6,677,226 B1 * | 1/2004 | Bowen et al. | ............... | 438/601 |
| 6,911,386 B1 * | 6/2005 | Lee et al. | ..................... | 438/612 |
| 7,144,749 B2 * | 12/2006 | Ng et al. | ........................ | 438/48 |
| 7,492,032 B2 * | 2/2009 | Bang et al. | .................... | 257/529 |
| 7,622,395 B2 * | 11/2009 | Bai et al. | ..................... | 438/723 |
| 7,632,748 B2 * | 12/2009 | Kim et al. | .................... | 438/601 |
| 2002/0079552 A1 * | 6/2002 | Koike | ......................... | 257/529 |
| 2004/0171263 A1 * | 9/2004 | Choi et al. | ................... | 438/691 |
| 2005/0087837 A1 * | 4/2005 | Omura et al. | ............... | 257/529 |
| 2005/0189612 A1 * | 9/2005 | Hung et al. | ................. | 257/529 |
| 2005/0233515 A1 * | 10/2005 | Ng et al. | .................... | 438/200 |
| 2005/0236688 A1 * | 10/2005 | Bang et al. | ................. | 257/529 |
| 2008/0160652 A1 * | 7/2008 | Bai et al. | ........................ | 438/9 |

* cited by examiner

*Primary Examiner*—Laura M Menz
(74) *Attorney, Agent, or Firm*—Quintero Law Office

(57) ABSTRACT

A method for fabricating a semiconductor device with a fuse element includes providing a semiconductor structure with a fuse element formed over a first device region thereof. A first interlayer dielectric layer, an etching stop layer and a second interlayer dielectric layer are sequentially formed. A bond pad is formed over the second interlayer dielectric layer in a second device region of the semiconductor structure. A passivation layer is formed over the bond pad and the second interlayer dielectric layer. A first etching process is performed to form a first opening in the first device region and a second opening in the second device region, wherein the first opening exposes a portion of the second interlayer dielectric layer over the fuse element and, and the second opening partially exposes a portion of the bond pad. A second etching process and a third etching process are performed to leave another passivation layer conformably covering the fuse element and the semiconductor structure adjacent thereto.

11 Claims, 3 Drawing Sheets

METHOD FOR FABRICATING SEMICONDUCTOR DEVICE WITH FUSE ELEMENT

CROSS REFERENCE TO RELATED APPLICATIONS

This Application claims priority of Taiwan Patent Application No. 98104438, filed on Feb. 12, 2009, the entirety of which is incorporated by reference herein.

BACKGROUND OF THE INVENTION

1. Field of the Invention

The present invention relates to semiconductor fabrication techniques, and in particular, to a method for fabricating a semiconductor device with a fuse element.

2. Description of the Related Art

For redistributing memory circuits and logic circuits in semiconductor devices, fuse elements are commonly applied. For example, defective memory cells or circuits in memory devices such as dynamic random access memory (DRAM) devices and static random access memory (SRAM) can be redistributed with a new active circuit by blowing up a fuse element in related circuits. Such circuit redistribution design incorporating fuse elements is helpful for improving product yield and reducing abandoned wafers with process deficiencies.

Fuse elements are typically integrated as a part of one of the metallization layers of semiconductor devices. One or more interlayer dielectric layer and a topmost passivation layer are provided over the fuse elements. Therefore, prior to blowing up of the fuse element by methods such as a laser trimming process, the passivation layer and the interlayer dielectric layers formed over the fuse elements are needed to be removed to form a laser access window and expose the fuse elements covered by an interlayer dielectric layer with a pre-determined thickness. The interlayer dielectric layer covering the fuse elements exposed by the laser access window protects the fuse elements from be subjected to corrosion or breakdown. The thickness of the interlayer dielectric layer left in the laser access window is proportional to the energy of the laser used in the laser trimming process.

The laser access window is typically formed after formation of the topmost passivation layer and the metallization layer and is simultaneously formed during patterning of the topmost passivation layer for forming an opening to expose a bond pad therein by methods such as an etching process.

The etching process for forming the laser access window not only passes through the topmost passivation layer but also passes through one or more interlayer dielectric layers under the passivation layer. Controlling the film thickness and uniformity of the interlayer dielectric layer left over the fuse elements in the laser access window is difficult.

If the interlayer dielectric layer left over the fuse elements in the laser access window is too thick, the fuse elements may not be blown up in a sequential laser trimming process. In addition, if the interlayer dielectric layer left over the fuse elements in the laser access window is too thin, the fuse elements may be corroded by moisture and air in the environment or ruined during the etching process for forming the laser access window prior to the laser trimming process. The undesired issues may affect reliability of a semiconductor device having the fuse elements.

BRIEF SUMMARY OF THE INVENTION

An exemplary method for fabricating a semiconductor device with a fuse element comprises providing a semiconductor structure having a first device region and a second device region. A fuse element is formed over the semiconductor structure in the first device region. A first interlayer dielectric layer is formed, conformably covering the fuse element and the semiconductor structure. An etching stop layer is formed, conformably covering the first interlayer dielectric layer. A second interlayer dielectric layer is formed, blanketly covering the etching stop layer, wherein the second interlayer dielectric layer is formed with a planar top surface. A bond pad is formed over the second interlayer dielectric layer in the second device region. A passivation layer is formed, conformably covering the bond pad and the second interlayer dielectric layer. A first etching process is performed to pattern the passivation layer, respectively forming a first opening in the first device region and a second opening in the second device region, wherein the first opening is substantially located over the fuse element and exposes a portion of the second interlayer dielectric layer, and the second opening is substantially located over the bond pad and partially exposes a portion of the bond pad. A second etching process is performed, removing the portion of the second interlayer dielectric layer exposed by the first opening and exposing a top surface and partial sidewalls of the etching stop layer formed over the fuse element. A third etching process is performed, removing the portion of the second interlayer layer, the etching stop layer, and a portion of the first interlayer dielectric layer exposed by the first opening such that another passivation layer conformably covering the fuse element and the semiconductor structure adjacent to the fuse element is left.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-6 are cross sections showing fabrication steps in an exemplary method for fabricating a semiconductor device with a fuse element, respectively.

Figure 1:
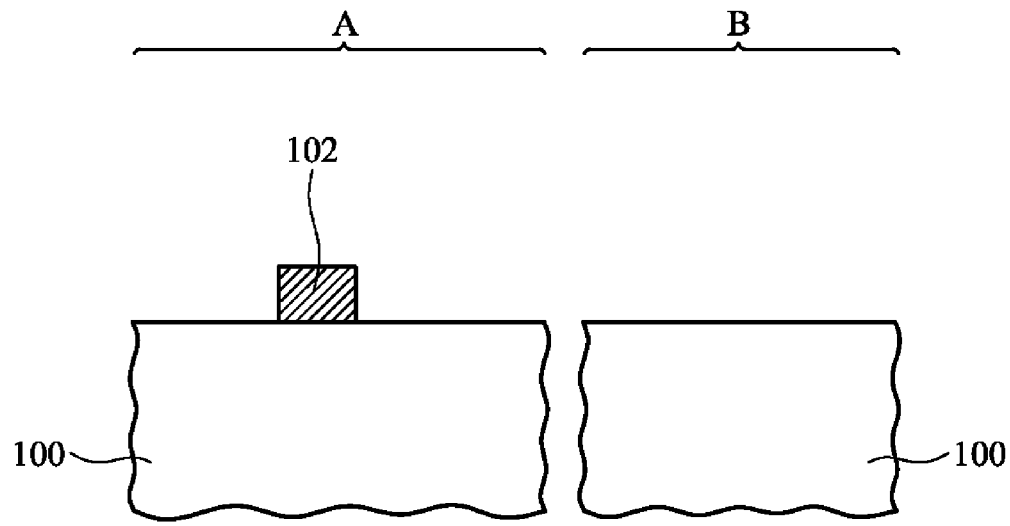
FIGS. 1-6 are cross sections of a method for fabricating a semiconductor device with a fuse element according to an embodiment of the invention.

Referring to FIG. 1, a semiconductor structure 100 is first provided, defined with various device regions A and B thereover. Herein, the semiconductor structure 100 is illustrated as a structure having a planar top surface for the purpose of simplifying the figure. It is noted that the semiconductor structure 100 can be a semiconductor substrate having a plurality of semiconductor devices and interconnect structures formed thereon. The semiconductor devices formed over the semiconductor substrate can be, for example, active devices such as transistors or diodes and/or passive devices such as capacitors, resistors and conductors. The interconnect structures in the semiconductor structure may comprise a multi-layer metallization structure isolated and supported by a plurality of interlayer dielectric layers. In this embodiment, the device region A functions as a device region for disposing fuse elements and the device region B functions as a device region for disposing a bond pad.

A conductive layer 102 is then formed over a portion of the semiconductor structure 100 in the device region A, functioning as a fuse element. The conductive layer 102 can be a single layer of aluminum or a composite layer of a stacked aluminum-copper (AlCu) alloy sub-layer and titanium nitride (TiN) sub-layer. The conductive layer 102 can be formed by conventional metal line fabrication and fabrication thereof is not described here, for simplicity. As shown in FIG. 1, the conductive layer 102 is illustrated as a metal line of a single layered configuration extending perpendicular to a surface of FIG. 1 but is not limited thereto. The conductive layer 102 can be formed with other aligning configurations and other film configurations.

Figure 2:
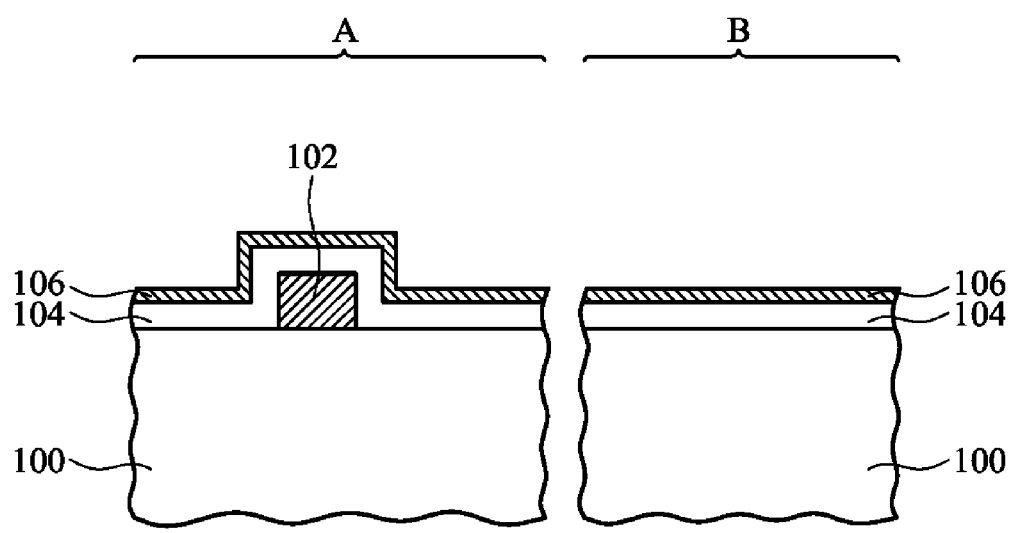

Referring to FIG. 2, an interlayer dielectric layer is then formed over the semiconductor structure 100 in the device regions A and B. Herein, the interlayer dielectric layer 104 conformably covers the conductive layer 102, the semiconductor structure 100 adjacent to the conductive layer 102 in the device region A, and the semiconductor structure 100 in the device region B. Next, an etching stop layer 106 is formed over the interlayer dielectric layer 104 in the device regions A and B. Herein, the etching stop layer 106 conformably covers the interlayer dielectric layer 104 in the device region A.

In one embodiment, the interlayer dielectric layer 104 can be formed with insulating materials such as a silicon oxide formed by methods such as a plasma-enhanced chemical vapor deposition (PECVD), or atmospheric pressure chemical vapor deposition (APCVD) method or combinations thereof, and has a thickness of about 2000-8000 Å. The etching stop layer 106 can be formed with insulating materials such as a silicon oxynitride formed by methods such as a PECVD method, and has a thickness of about 100-700 Å.

Figure 3:
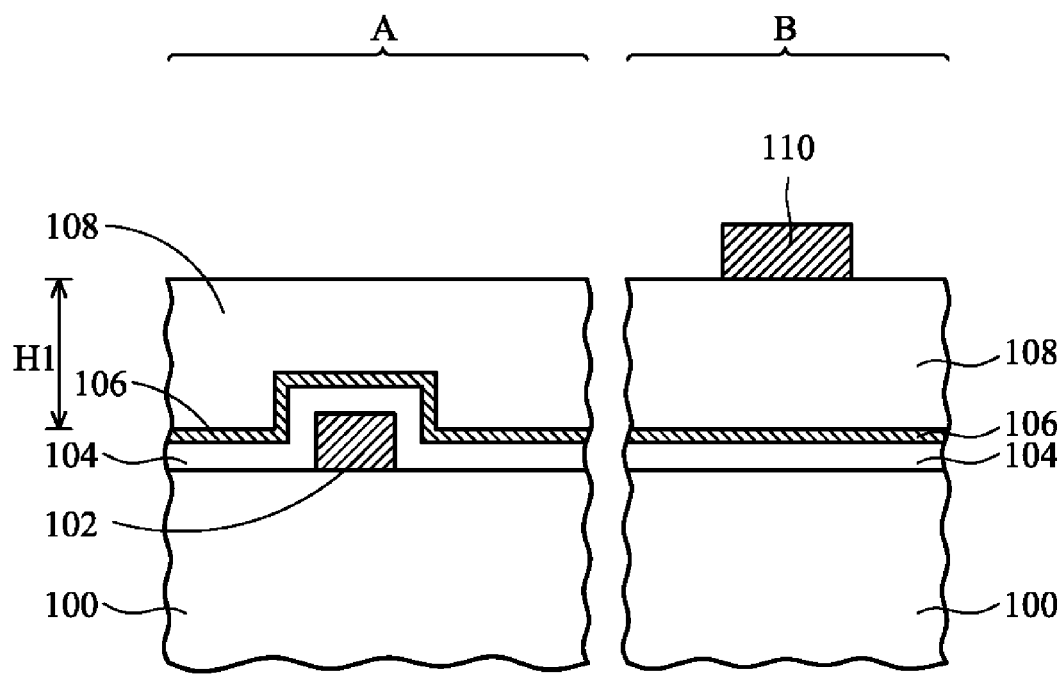

Referring to FIG. 3, a layer of insulating material is blanketly deposited over the structure illustrated in FIG. 2, thereby covering the etching stop layer 106 in the device regions A and B. The layer of insulating material is then planarized by a planarization process (not shown) such as a chemical mechanical polishing (CMP) process, thereby leaving an interlayer dielectric layer 108 over the etching stop layer 106 in the device regions A and B. Herein, the interlayer dielectric layer 108 is formed with a planar top surface and the interlayer dielectric layer 108 may comprise insulating material such as a silicon oxide formed by methods such as a PECVD method. After planarization, the top surface of the interlayer dielectric layer 108 is apart from a top surface of the conductive layer 102 in a distance H1 of about 2000-8000 Å.

Next, a conductive layer 110 is formed over a portion of the interlayer dielectric layer 108 in the device region B, thereby functioning as a bond pad. The conductive layer 110 can be a single layer of aluminum or a composite layer of a stacked aluminum-copper (AlCu) alloy sub-layer and titanium nitride (TiN) sub-layer. The conductive layer 110 can be formed by conventional metal line fabrication and fabrication thereof is not described here, for simplicity.

Figure 4:
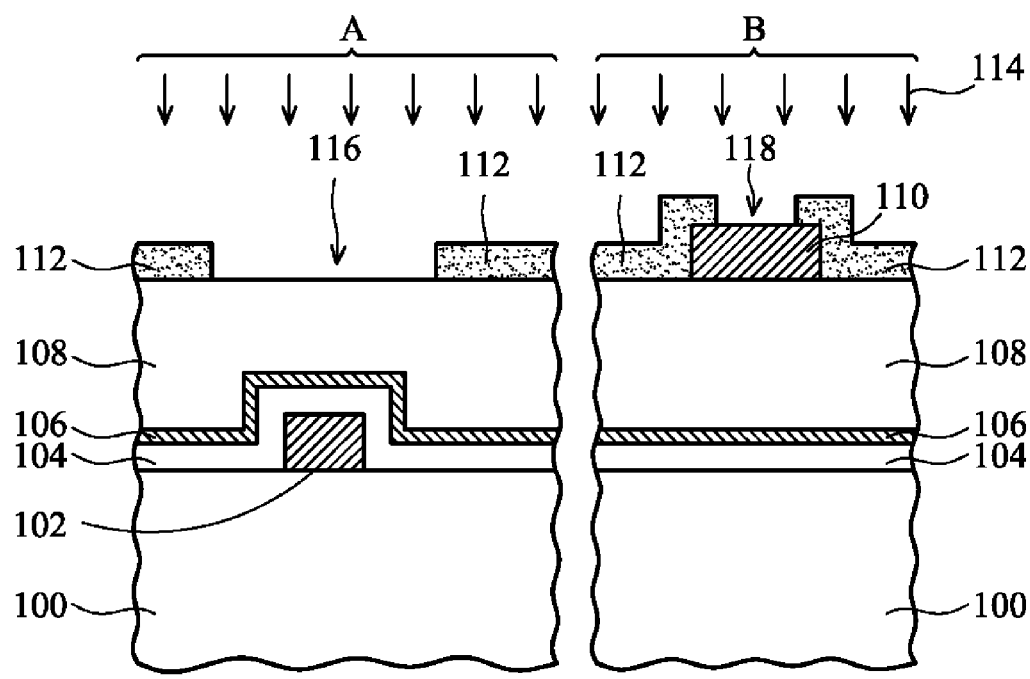

Referring to FIG. 4, a passivation layer 112 is formed over the interlayer dielectric layer 108 in the device regions A and B. Herein, the passivation layer 112 conformably covers the interlayer dielectric layer 108 and the conductive layer 110 formed over the interlayer dielectric layer 108 in the device region B. The passivation layer 112 may comprise insulating materials such silicon nitride formed by methods such as a PECVD method, and has a thickness of about 1000-2000 Å.

Next, an etching process 114 is performed, using suitable mask patterns (not shown), to pattern the passivation layer 112, thereby forming an opening 116 and 118 in the device regions A and B, respectively. As shown in FIG. 4, the opening 116 is substantially located at a place over the conductive layer 102 functioning as the fuse element, thereby partially exposing a top surface of the interlayer dielectric layer 108. The opening 118 in the device region B only exposes a portion of a top surface of the conductive layer 110 functioning as the bond pad. Herein, the etching process 114 can be a dry etching process utilizing etching gases comprising $CF_4$, $CHF_3$, $SF_6$ and Ar to partially remove the passivation layer 112 and not the interlayer dielectric layer 108.

Figure 5:
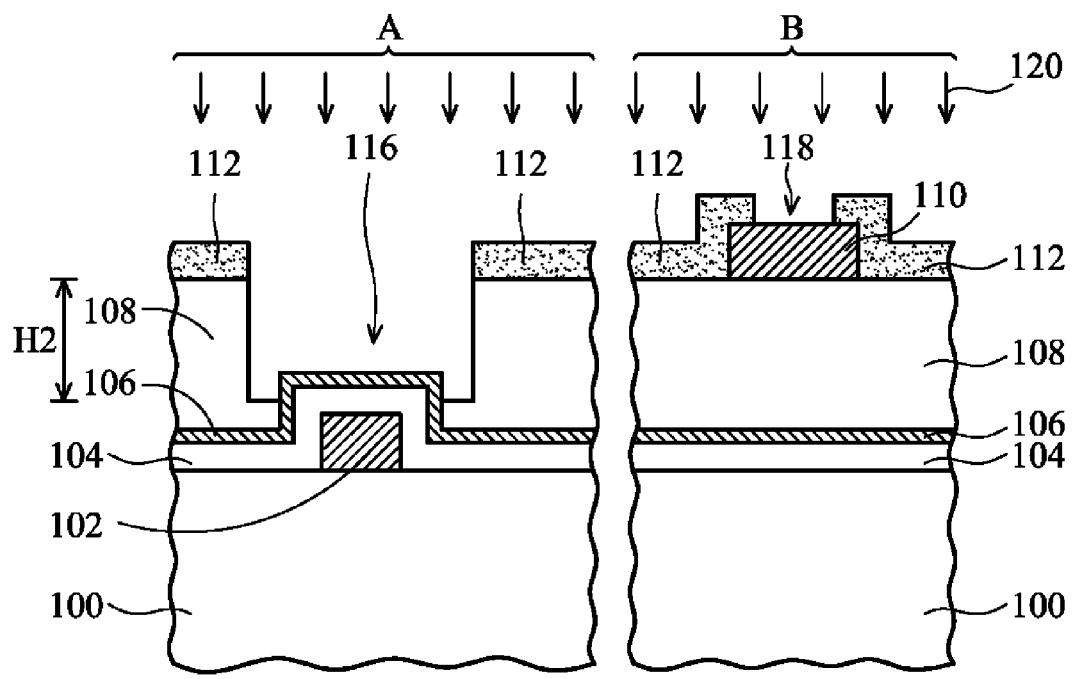

Referring to FIG. 5, another etching process 120 is performed, using the pattered passivation layer 112 as an etching mask, to remove the interlayer dielectric layer 108 exposed by the opening 116 until a top surface and portions of sidewalls of the etching stop layer 106 formed over the conductive layer 102 are exposed. The etching process 120 can be a dry etching process utilizing etching gases comprising $C_4F_8$, CO, Ar and $O_2$, thereby removing the interlayer dielectric layer 108 and not the etching stop layer 106. In the etching process 120, an optional over-etching process can be further adopted to entirely remove the interlayer dielectric layer 108 above the top surface of the etching stop layer 106. Therefore, a top surface of the interlayer dielectric layer 108 left in the opening 116 is slightly below the top surface of the etching stop layer 106 adjacent thereto and the remaining interlayer dielectric layer 108 in the opening 116 has a distance H2 of about 4000~10000 Å from the top surface of the remaining interlayer dielectric layer 108.

Figure 6:
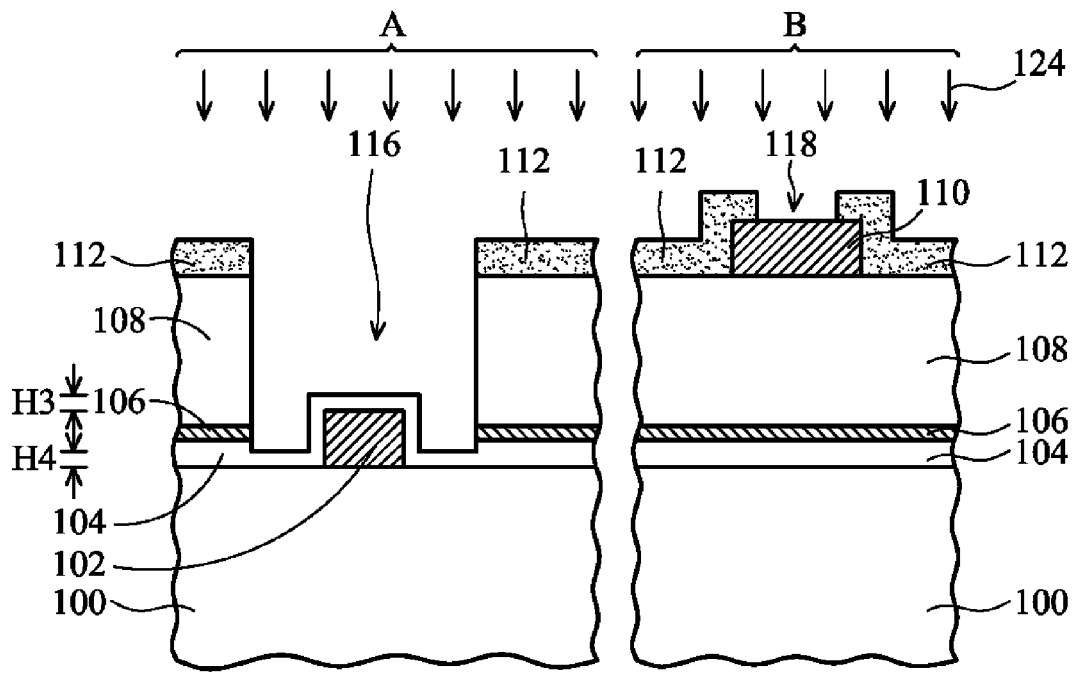

Referring to FIG. 6, another etching process 124 is then performed, using the patterned mask layer 112 as an etching mask, to remove the etching stop layer 106 in the opening 116 in the device region A, thereby leaving a thinned interlayer dielectric layer 104 over the conductive layer 102 and the semiconductor structure 100 adjacent thereto.

Herein, the above etching process 124 can be a dry etching process utilizing etching gases comprising $CF_4$, $CHF_3$, Ar and $O_2$ to remove the etching stop layer 106 and portions of the interlayer dielectric layer 108 over the etching stop layer 108. In the etching process 124, an over etching process is included to partially remove the interlayer dielectric layer 104 in the opening 116, thereby forming a residue interlayer dielectric layer 104 in the opening 116, having a distance H3 and H4 of about 2000-6000 Å and 0~5000 Å from the top surface of the conductive layer 102 and the semiconductor structure 100, respectively.

Herein, the opening 116 in FIG. 6 functions as a laser access window for a sequential laser trimming process and the portion of the interlayer dielectric layer 104 exposed in the opening 116 functions as an overlying passivation layer of the fuse element (i.e the conductive layer 102). The thickness of the interlayer dielectric layer 104 left over the top surface of the conductive layer 102 and the semiconductor structure 100 adjacent thereto can be controlled in a range of 2000~7000 Å by the multiple etching processes illustrated in FIGS. 4-6. Therefore, the interlayer dielectric layer 104 left over the top surface of the conductive layer 102 is similar with that left over the semiconductor structure 100 and a passivation layer of improved film thickness and film uniformity is obtained, thereby enhancing performance of a sequential layer trimming process and improving yield and reliability of a semiconductor device with the fuse element illustrated in FIG. 6.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device with a fuse element, comprising:
    providing a semiconductor structure having a first device region and a second device region;
    forming a fuse element over the semiconductor structure in the first device region;
    forming a first interlayer dielectric layer, conformably covering the fuse element and the semiconductor structure;
    forming an etching stop layer, conformably covering the first interlayer dielectric layer;
    forming a second interlayer dielectric layer, blanketly covering the etching stop layer, wherein the second interlayer dielectric layer is formed with a planar top surface;
    forming a bond pad over the second interlayer dielectric layer in the second device region;
    forming a passivation layer, conformably covering the bond pad and the second interlayer dielectric layer;
    performing a first etching process to pattern the passivation layer, respectively forming a first opening in the first device region and a second opening in the second device region, wherein the first opening is substantially located over the fuse element and exposes a portion of the second interlayer dielectric layer, and the second opening is substantially located over the bond pad and partially exposes a portion of the bond pad;
    performing a second etching process, removing the portion of the second interlayer dielectric layer exposed by the first opening and exposing a top surface and partial sidewalls of the etching stop layer formed over the fuse element; and
    performing a third etching process, removing the portion of the second interlayer dielectric layer, the etching stop layer, and a portion of the first interlayer dielectric layer exposed by the first opening such that another passivation layer conformably covering the fuse element and the semiconductor structure adjacent to the fuse element is left.

2. The method as claimed in claim 1, wherein the first and second interlayer dielectric layers comprise silicon oxide, the passivation layer comprises silicon nitride, and the etching stop layer comprises silicon oxynitride.

3. The method as claimed in claim 1, wherein the first etching process is a dry etching process utilizing etching gases comprising $CF_4$, $CHF_3$, $SF_6$ and Ar.

4. The method as claimed in claim 1, wherein the second etching process is a dry etching process utilizing etching gases comprising $C_4F_8$, $CHF_3$, Ar and $O_2$.

5. The method as claimed in claim 1, wherein the third etching process is a dry etching process utilizing etching gases comprising $CF_4$, $CHF_3$, Ar and $O_2$.

6. The method as claimed in claim 1, wherein after the second etching process, a residue portion of the first interlayer dielectric layer is left at the sidewalls of the etch stop layer, and the residue portion of the first interlayer dielectric layer is apart from the first interlayer dielectric layer adjacent to the first opening in a distance of about 2000-6000 Å.

7. The method as claimed in claim 1, wherein after the third etching process, the another passivation layer conformably covering the fuse element and the semiconductor structure adjacent to the fuse element has a thickness of about 0-5000 Å over the top surface of the fuse structure and a thickness of about 2000-6000 Å over the surface of the semiconductor structure.

8. The method as claimed in claim 1, wherein the fuse element comprises aluminum.

9. The method as claimed in claim 1, wherein the fuse element comprises aluminum-copper alloy and titanium nitride.

10. The method as claimed in claim 1, wherein the bond pad comprises aluminum.

11. The method as claimed in claim 1, wherein the bond pad comprises aluminum-copper alloy and titanium nitride.

* * * * *